(12) United States Patent
Burgess

(10) Patent No.: US 7,062,845 B2
(45) Date of Patent: Jun. 20, 2006

(54) CONVEYORIZED BLIND MICROVIA LASER DRILLING SYSTEM

(75) Inventor: Larry W. Burgess, Wilsonville, OR (US)

(73) Assignee: Laservia Corporation, Wilsonville, OR (US)

( * ) Notice: Subject to any disclaimer, the term of this patent is extended or adjusted under 35 U.S.C. 154(b) by 288 days.

(21) Appl. No.: 10/389,544

(22) Filed: Mar. 14, 2003

(65) Prior Publication Data

US 2004/0118824 A1 Jun. 24, 2004

Related U.S. Application Data

(63) Continuation-in-part of application No. 09/823,217, filed on Mar. 30, 2001, now Pat. No. 6,631,558, which is a continuation-in-part of application No. 09/194,933, filed on Dec. 4, 1998, now Pat. No. 6,211,485, which is a continuation-in-part of application No. PCT/US97/09732, filed on Jun. 5, 1997.

(60) Provisional application No. 60/366,484, filed on Mar. 20, 2002, provisional application No. 60/019,140, filed on Jun. 5, 1996.

(51) Int. Cl.
*B23P 19/00* (2006.01)
(52) U.S. Cl. .............................. 29/759; 29/745; 29/847; 29/846; 29/852; 219/121.6; 219/121.78; 219/653
(58) Field of Classification Search ................ 29/852, 29/759, 745, 847, 846, 829, 857; 219/121.6, 219/121.78, 121.75, 653
See application file for complete search history.

(56) References Cited

U.S. PATENT DOCUMENTS 4,500,389 A 2/1985 Lassen (Continued)

FOREIGN PATENT DOCUMENTS

JP 61-229492 10/1986

(Continued)

OTHER PUBLICATIONS

Kestenbaum, et al., *Laser Drilling of Microvias in Epoxy-Glass Printed Circuit Boards*, IEEE Transaction on Components, Hybrids, and Manufacturing Tech., Dec. 1990, vol. 13, No. 4, pp. 1055-1062, especially Fig. 10 and p. 1061.

(Continued)

*Primary Examiner*—David P. Bryant
*Assistant Examiner*—Stephen Kenny
(74) *Attorney, Agent, or Firm*—Marger Johnson McCollom, P.C.

(57) ABSTRACT

A laser drilling system for drilling blind vias in printed circuit board panels, multichip modules and chipscale packages with top and bottom surfaces and which include multiple dielectric polymer and metal layers. The system includes a first laser module comprising a laser able to form at least one via per pulse through one or more polymer layers. The vias are circular or non-circular in shape. An articulated arm is adapted to move at a speed of about 200 inches per second and at an acceleration of about 5 g's or more. A beam delivery unit is attached to the articulated arm and a conveyor adapted to move panels at a constant speed. The first laser module positioned on a separate track from the conveyor moves at a faster rate than the conveyor to drill the top surface. A second laser module is positioned to move on another separate track from the conveyor movable at a faster rate so as to drill the bottom surface.

8 Claims, 22 Drawing Sheets

U.S. PATENT DOCUMENTS

| | | | |
|---|---|---|---|
| 4,504,727 A | | 3/1985 | Melcher et al. |
| 4,544,442 A | | 10/1985 | Lassen |
| 4,606,747 A | | 8/1986 | Steinhoff |
| 4,642,160 A | | 2/1987 | Burgess |
| 4,644,130 A | | 2/1987 | Bachmann |
| 4,764,485 A | | 8/1988 | Loughran et al. |
| 4,789,770 A | | 12/1988 | Kasner et al. |
| 5,010,232 A | | 4/1991 | Arai et al. |
| 5,022,960 A | | 6/1991 | Takeyama et al. |
| 5,073,687 A | | 12/1991 | Inagawa et al. |
| 5,087,396 A | | 2/1992 | Zablotny et al. |
| 5,108,785 A | * | 4/1992 | Lincoln et al. ............ 427/555 |
| 5,173,442 A | | 12/1992 | Carey |
| 5,263,243 A | | 11/1993 | Tameda et al. |
| 5,317,801 A | | 6/1994 | Tanaka et al. |
| 5,323,520 A | | 6/1994 | Peters et al. |
| 5,367,143 A | | 11/1994 | White, Jr. |
| 5,378,869 A | * | 1/1995 | Marrs et al. ........... 219/121.71 |
| 5,614,114 A | * | 3/1997 | Owen .................... 219/121.66 |
| 5,666,722 A | | 9/1997 | Tamm et al. |
| 5,707,749 A | | 1/1998 | Katagiri et al. |
| 5,830,782 A | | 11/1998 | Smith et al. |
| 5,844,200 A | | 12/1998 | Leader et al. |
| 5,863,405 A | | 1/1999 | Miyashita |
| 5,959,354 A | | 9/1999 | Smith et al. |
| 6,107,003 A | | 8/2000 | Kuwako |
| 6,609,297 B1 | | 8/2003 | Hiramatsu et al. |
| 6,822,187 B1 | * | 11/2004 | Hermann et al. ...... 219/121.63 |

FOREIGN PATENT DOCUMENTS

| | | |
|---|---|---|
| JP | 2-147182 | 6/1990 |
| JP | 2-192885 | 7/1990 |

OTHER PUBLICATIONS

Hecht, Jeff, *The Laser Guidebook*, New York: McGraw-Hill, 1992, pp. 161-167, especially p. 163.

D'Ambra et al., *Via formation in green ceramic dielectrics using a YAG laser*, IEEE Electronic Components and Technology Conference. New York: IEEE, 1992, pp. 1072-1081, especially p. 1078 and Fig. 7.

Hodson, Timothy L., *Using Laser-Drilled Blind Vias to Maximize Board Capacity*, Electronic Packaging & Production, Mar. 1992, p. 83.

Grace, Jim et al., *Fulfilling the Demand for Greater Circuit Densities*, CircuiTree, Jun. 1992, pp. 24-26.

Grace, Jim, *Achieving Higher Circuit Densities Through Cost-Effective Blind Vias*, Electronic Packaging & Production, Jun. 1993, pp. 46-48.

Carpenter et al., Richard, *SLC: An Organic Packaging Solution for the Year 2000*, IPC Expo, Proceeding of the Technical Conference, Mar. 1996, pp. S14, 2, 1-S14, 2,6.

Oxford, Rex, *Plasma Formed Microvias for Future High Density Interconnects*, IPC Expo, Proceeding of the Technical Conference, Mar. 1996, pp. S14, 3,1-S14, 3,2.

Powell, David J., *High Speed Laser Ablation of Microvia Holes in Nonwoven Aramid Reinforced Printed Wiring Boards to Reduce Cost*, IPC Expo, Proceeding of the Technical Conference, Mar. 1996, pp. S18, 3, 1-S18,3,11.

Tourne, Joan, *Microvias, a New Cost-Effective Interconnection Technology*, IPC Expo, Proceeding of the Technical Conference, Mar. 1996, pp. S18, 4,1-S18,4,4.

Cable, Alan, *New Laser Processes and Wavelengths for Drilling Through-vias and Blind Vias in a Wide Range of Circuit Board Materials*, IPC Expo, Proceeding of the Technical Conference, Mar. 1996, pp S18, 5, 1-S18,5, 9.

Maliniak, David, *On the Road(map): Interconnects Face The Future*, Electronic Design, Oct. 13, 1995, pp. 77-78; 80; 82; 84-85.

Murray, Jerry, *At Double Header*, Printed Circuit Fabrication, May 1996, p. 64.

Sakamoto et al., *The Evolution and Continuing Development of ALIVH High-Densit Printed Wiring Board*, Apr. 4-6, 2000, "Best Paper at IPC Expo 2000."

* cited by examiner 1 of 8 carriage bolts with springs

Bottom View

Bottom View

CONVEYORIZED BLIND MICROVIA LASER DRILLING SYSTEM

RELATED APPLICATION DATA

This application claims benefit to Provisional application U.S. Ser. No. 60/366,484 filed on Mar. 20, 2002 and is a continuation-in-part of U.S. Ser. No. 09/823,217 filed Mar. 30, 2001, now U.S. Pat. No. 6,634,558 which is a continuation-in-part of U.S. Ser. No. 09/194,933, filed Dec. 4, 1998, now U.S. Pat. No. 6,211,485, which is a continuation in part PCT/US97/09732, filed Jun. 5, 1997, and from U.S. Ser. No. 60/019,140, filed Jun. 5, 1996, all commonly owned and incorporated herein by reference.

BACKGROUND OF THE INVENTION

The present invention relates to a laser system and method of forming production volumes of economical and reliable blind vias in circuit boards, polymer based multichip modules and chipscale packages at speeds estimated to exceed 2,000 per second.

Laser drilled blind vias are constructed by passing and pulsing laser beam radiation over a pre etched window to remove dielectric material. The use of pre etched windows as a mask for laser drilling multilayer circuit boards is disclosed in U.S. Pat. No. 4,642,160. The method for making an interconnection down to the third level is also disclosed in U.S. Pat. No. 6,211,485 and copending U.S. Ser. No. 09/823,217, incorporated by reference. The novelty of the invention disclosed herein is that it does not follow the typical known methods for laser drilling circuit boards. Conventional thinking suggests that increased speed for laser drilling is enhanced only by increasing the pulsing rate. Furthermore, the conventional view is that increased pulse rates offers more peak power which is believed to be the primary element needed to remove materials including the dielectric materials used in the fabrication of circuit boards. While there is proof that the above described conditions are true for many dielectric material like the traditional FR4 materials used in most circuit board applications, the method is slow when compared to what is disclosed in this invention.

The method described herein takes into account the physics of materials, the physics of laser beam technology and 'marries' these physical conditions that blend to make the most open opportunity for what is termed a 'wide process window'. This is best understood by noting the process and laser system about to disclosed can be operated by a person who has been trained to run a conventional circuit board mechanical drilling system instead of a higher level technician or engineer as is normal for most laser drilling systems currently in use in circuit board fabrication. The results of using a system as disclosed herein is significant cost saving where in some cases the output can be as high as 40 times laser drilling systems currently in use.

Laser drilling as a method for producing blind or buried microvias has risen to become the prevailing and most common method. As the microvia market and technology mature the demand will move toward making more z-axis interconnects down to level three as described in U.S. Pat. No. 6,211,485 and further down to levels four, five etc. Since there are other conditions that create difficulty in completing the fabrication of microvias especially as the feature sizes shrink down to below 0.076 mm (0.003") a slot design is extremely important. These slot can also be multilevel (U.S. patent application Ser. No. 09/823,217) which also compli-cate the laser drilling and fabrication process. The most compelling reason for using slots as opposed to round opening in circuit board designs where the feature sizes are less than 0.076 mm (0.003"), is for ease in plating where the solutions can find a wider opening to flow in and out of the blind structure. There is, however, one other complication where a pulsing laser system is used to remove dielectric. That is, there is a constant and consistent overlap of the laser beam is normal accepted blind via laser drilling which can readily damage the blind via slot. The laser system for producing laser drilled blind microvias (especially slots) and the method described in this disclosure eliminate this issue and enable a high yield process, expected to be better than single-digit defects in parts per million.

Circuit board designs have become so dense that the only method for increasing component density is to use blind and buried microvias which are typically considered 0.127 mm (0.005") or less in diameter. The cost for producing laser drilled blind vias has become cost-effective to the level that the laser is the method of choice. The speed of laser drilling blind microvias has also improved which is the primary reason that this method is the dominant technique. The next growth will be an extension of laser drilling blind microvias as the cost for producing these microvias is low enough to use as the method of choice for producing buried microvias. A buried microvia 35 is one that is internal in the circuit board not directly reaching the outer layers on either side but interconnecting two or more layers of internal circuitry as shown in FIG. 18. A buried microvia does not occupy surface area on the outside of an interconnecting substrate (circuit board, multichip module or chipscale package) and therefore allows very efficient interconnections to take place promoting improved component density on the surface.

The critical aspect of adopting either blind or buried microvia and especially variable depth interconnecting strategies is not the design but the cost to produce both of these advanced technologies. The costs must to be low enough that original equipment manufacturers (OEMs) will adopt blind and buried microvia technology plus the circuit board fabricators have to be able to effectively produce these advanced interconnections at a high yield and in volume. This invention, which includes a conveyorized laser drilling system (which also can be run in a manual or hand load mode), also provides a method which is extremely broad or open in process parameters which drops the operating costs to a level where it will support advanced consumer products such as 3rd generation (called 3G) personal devices such as mobile or cell phone and Internet connecting devices that are portable. At the other end of the spectrum are the very dense high layers large circuit boards that have reached and exceeded the possibility of mechanical drilling even microvia through the circuit board and now demand both blind and buried microvias. These are large circuit boards from Internet switch and router OEM companies known to be from 40 layers up to +50 layers.

In addition to the volume demand this invention pushes forward to provide for variable depth interconnections down to the fourth level, which allows for power and ground to be included for shielding high speed signal layer pairs, making the disclosed design and process very cost-effective.

The laser drilling system, method and interconnections described in this invention allow this segment of the circuit board fabrication process to be automated and follow all of the other segments which have been automated with conveyors moving panels in a constant mode for higher output. In order to accomplish the automation described in this invention, the following elements must be included which also increase yield and high output both at the same time which is considered non-normal or counter intuitive:

Conformal Mask (U.S. Pat. No. 4,643,160)
Variable Depth Interconnections to reflect off of buried copper surfaces (U.S. Pat. No. 6,211,485)
Single Pulse Beam Delivery (U.S. Pat. No. 6,211,485)
Constant "high speed" beam movement
Controlled laser beam energy (beam speed, pulse width, focus)
Compatible materials that do not move or slightly move during lamination and other process steps in fabrication.

With the number of blind and buried microvias on a square meter totaling over 2 million and expected to double in the next three years, the method for manufacturing or fabrication these blind and buried microvias must both improve in output speed and yield. This invention serves both the demand for improved output and yield.

The material of choice whose absorption matches the RF-Excited CO2 wavelength (10.6 micron preferred) is a non-woven aramid material that is called Thermount®. This material is produced by DuPont Fibers and is typically epoxy coated to match the characteristics of the most common circuit board material called FR4, which is normally included in a "hybrid" multilayer format since it is a cheaper and well accepted material. There is also a higher temperature version of this same kind of "hybrid" multilayer that uses polyimide instead of epoxy resin. Multiple material laminators or 'treaters' are processing version of the epoxy and polyimide coated Thermount®, including Arlon, Polyclad and Nelco (Dielektra) along with laminators in Japan and Taiwan. Arlon is coming out with a high performance version that uses another dielectric material which is a butyl rubber/cyanate ester resin rather than epoxy or polyimide.

Another material that was developed in conjunction with an earlier patent (U.S. Pat. No. 4,642,160) is currently commercially available through Isola Laminate Systems. This material called 'resin coated copper or resin coated foil' is a two part epoxy coated copper foil. The epoxy next to the foil is in the C stage or cured and the other epoxy coating is in the B stage or prepreg as noted by the circuit board industry. This material is falling out of favor for two reasons: first, it does have some crazing and cracking that can occur when processed, especially at thicker levels, and it does not allow for processing variable depth interconnection since it does not come in a pure prepreg or clad on either side. A fuller discussion will outline and detail how both prepreg and thin core laminates can be used to make interconnection in a cost-effective manner down to the fourth level and deeper.

A positive outgrowth of the invention describe in this disclosure is the ability to rapidly and cleanly remove large area of dielectric material. This is easily understood when the system is used to laser drill slots as shown in FIGS. 15 and 16. A natural outcome from this large area dielectric material removal is that an even larger area can be removed so that an integrated circuit or other semiconductor chip can be placed into the opening. Removing large area of dielectric material is quite time consuming with the point-to-point system that typically use a galvanometer and index the table many times. These systems use a nearly focused beam and therefore create more heat which will create charring or the flow of most resins that make up dielectric materials. These large areas as shown in FIG. 17 are used in "smart cards" which are made in huge volumes for consumers and demand a very low cost, which therefore much be rapidly processed.

The laser system and method described herein will rapidly and reliably produce drilling blind and buried vias at multiple depths, plus multiple depth slots described in this invention allowing blind vias to be economically introduced into interconnect packaging designs. In addition, it will lend itself to laser processing large openings for Chip-in-Board applications at greatly reduced costs due to the fast processing speeds.

SUMMARY OF THE INVENTION

It is the object of this invention to automate production for producing large volumes of laser drilled blind microvias in multilayer circuit board panels, and polymer based Multichip Module (MCM), Chip-on-Board (COB), Chip-in-Board (CIB) and Chip Scale Packages (CSP) and other substrates utilizing modified and traditional circuit board techniques. These interconnects need to be microvias laser drilled at such a rate that will make the laser drilling method for variable depth blind via drilling economically feasible. In addition, these laser drilled blind and buried interconnections need to be capable of interconnecting three, four and more levels or layers or circuitry.

The natural outcome of this production method and laser drilling system will be a significant step to cut the processing costs and improve yield for the explosive growth of blind and buried microvias. The new laser system disclosed in this invention features the reduction of the manufacturing systems costs by eliminating expensive precision components that are necessary in all other known systems for drilling blind and buried microvias. In addition, the footprint will be significantly smaller than other systems that have automation for loading and unloading and it will be the first conveyorized system that can match up to a sister machine for laser drilling the opposite side.

The system described in this invention will use an articulated arm which will keep the beam at a constant distance, but most importantly allow it to move at an unprecedented speed of up to 300 meters per minute (200 inches per second). In addition the articulated arm will be accelerated at a rate just short of 5 g's (1 g=9.8 m/sec$^2$) in order to cut down the time and distance traveled as the beam is scanned over the conformal mask. For this reason it would be impossible to effectively manufacture a vacuum hold down for assuring the panel would stay in place during the laser drilling process. The thicker the panel the more weight associated with the demand on the vacuum system, therefore it was best to hold the panel stationary. Another critical aspect of this invention is that if one were to try to move the panel on a X/Y stage at an acceleration rate of up to 5 g's, the panel could actually become a projectile and create serious danger to the system or even a person if it were to come loose from the vacuum table. Therefore, the preferred method is to move the laser beam and not try to move the panel.

The marriage of several physical components for this invention are not obvious since the natural tendency is to work up the laser beam with more and shorter pulses which improves the peak power of the laser beam, but unfortunately also forces the beam to be precisely oriented over the pre-etched window for a period of time sufficient to accomplish the removal of the dielectric material. This invention is a true drill-on-the-fly method, as the laser beam is "dragged" over the pre-etched window. A long focal length beam lens allows the beam to penetrate deeply into the dielectric material and "cleanly" remove material with a single pulse. One of the most counter-intuitive characteristics of the method described in this invention is the ultra-clean surfaces of copper on the second level and at the bounce pad at the base of the blind microvia, where the laser beam is reflected from these surfaces 14 with a single pulse (as shown in FIGS. 7, 9, 11, and 13). The single pulse does not create charring, because the processing temperature from the laser drilling and the heat-affected zone (HAZ) are kept below the charring temperature. Also, there is no second, third or more pulses to blast back into the debris that is trying to exit the blind microvia.

One aspect of the invention is a laser drilling system comprising an RF excited CO2 laser, of 240 to 500 watts, to take advantage of the dissipated laser beam where the energy is controlled by defocus, pulse width and speed over the conformal mask. The beam is held to a constant length and still able to move at high speed rates by traveling through an industrial articulated arm, which is essential to keep the energy delivered at the surface and into the via substantially constant as the beam and arm travel across and over the panel. This is because the RF Excited CO2 laser delivers a constant or level output in watts, so that controlling the energy that enters the etched windows is first by pulse width and second by the speed of the beam as it passes over the etched window.

Another aspect of the invention is a blind microvia laser drilling method for drilling blind microvias in a circuit board, polymer-based multi-chip module or chipscale package. The method comprises laser drilling through a pre defined mask that defines the size of the blind microvias on a substrate, using the reflective characteristics of the mask over the dielectric material and a blind pin under a layer of the dielectric material. The CO2 laser vaporizes dielectric material in the substrate in a single pulse per microvia. The laser beam is produced by pulsing a CO2 laser which has a power output of at least 240 watts, and focusing the beam through the substrate to a depth sufficient to broaden the laser beam density at the substrate surface, allowing the radiant beam to reflect off a copper mask on the surface of the panel and also reflect off a blind pin at the bottom and/or mid-shelf of the blind microvia. A beam expander or collimator can be used to expand the beam and also to drop the energy at the surface while allowing the beam to create a swath for drilling microvias as it passes over this swath (shown in FIGS. 8, 10, 14 and 16 and indicated as 19, 21, 23, and 26 respectively).

The invention enables the production of variable-depth blind and buried microvias and slots. In addition, the movement of the beam is advantageous for removing larger areas of materials to create opening for components that can be buried in interconnecting substrates, e.g., circuit boards, multichip modules and other chipscale packages.

The foregoing and other objects, features and advantages of the invention will become more readily apparent from the following detailed description of a preferred embodiment of the invention which proceeds with reference to the accompanying drawings.

DETAILED DESCRIPTION

Overview of System and Process

In accordance with a preferred embodiment of the present invention, a laser system is constructed by integrating a sufficiently powerful (preferably >240 watts, more preferably 500 watts) sealed carbon dioxide (CO2) laser emitting an infrared (10.6 micrometer) laser beam pulsed by using radio frequency controls (RF excited). Synrad, Inc. (Mukilteo, Wash., U.S.A.), Rofin Sinar (Hamburg, Germany) and Coherent, Inc., (Santa Clara, Calif., U.S.A.) make lasers that can be adapted to perform as described herein. The 10.6-micrometer frequency of the laser beam is important so that the natural reflective properties can be utilized where the beam is not absorbed by the copper clad of the circuit board conformal coat, allowing the copper clad thickness to be very thin. Since the process of removing dielectric material is a photo-therm process, heat is involved and must be controlled to the extent possible. The other material contributing to the success of the present invention is a dielectric material having a compatible absorption. The most readily available dielectric material that fits into the scheme disclosed herein is a non-woven aramid that can be processed with a low fluence beam. A low fluence beam can be described as a laser beam of low radiant energy and viewed as a "top hat" Gaussian Curve.

Earlier forms of laser drilling of blind microvias are described in applicant's prior U.S. Pat. Nos. 4,642,160 and 6,211,485 and U.S. Ser. No. 09/194,933. The described methods and systems then available were insertable for laser drilling at multiple depths, drilling-on-the-fly using a single pulse per via. This invention carries forward additional system improvements for beam delivery and process improvements primarily through the invention of a laser drilling system and beam delivery allowing the method described to cost effectively be fabricated on a production basis to meet the extensive demand of blind microvias in the international market.

Description of Apparatus

Figure 22:
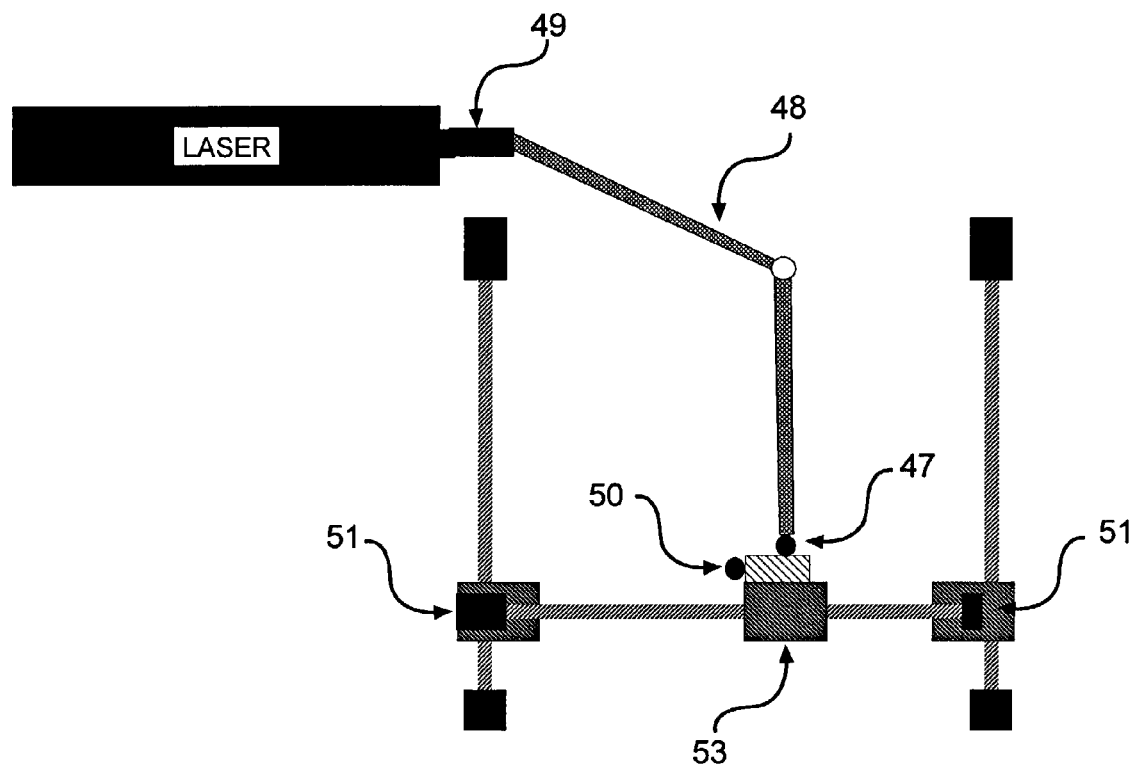
FIG. 22 is a top view of a motion control and laser drilling system with articulated arm 48.
Figure 23:
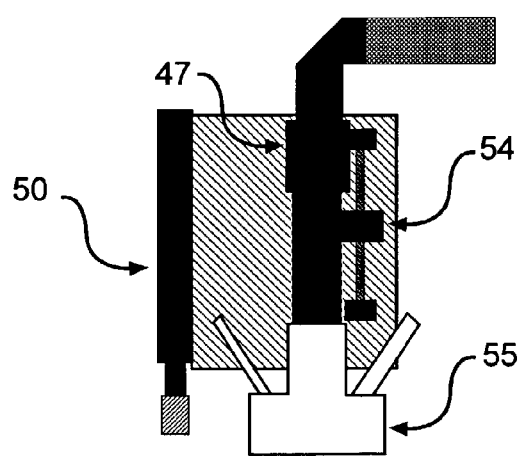
FIG. 23 is a cross-sectional view of a beam deliver 47 with off-set optical CCD,camera 50 and air/exhaust chamber 55.

Referring to FIGS. 22–23, the laser beam is set to travel inside an articulated arm 48, to the beam delivery, entering into a beam bender 47 through a collimator and an adjustable focusing caliper 54, where the final lens is a part of the beam delivery unit and is placed above the exhaust and air delivery fixture 55. An offset CCD camera 50 is attached to the same caliper 54, so that the camera is in the same focus as the beam delivery. Alternatively or additionally, the entire vacuum table 57 (FIG. 24) can be vertically moved to compensate for the panel thickness. Another alternative is to have a third focusing element, wherein the camera and beam delivery are configured to move as a unit and the beam delivery has a secondary independent focusing caliper.

The motion control system comprises linear motors 51 in FIG. 22 that position the beam delivery in the Y axis and a single linear motor 31, that position the laser beam in the X axis. There will most likely be a primary axis where the beam will move at maximum speed and acceleration and a secondary axis where the speed and acceleration will travel at a lesser velocity.

Figure 1:
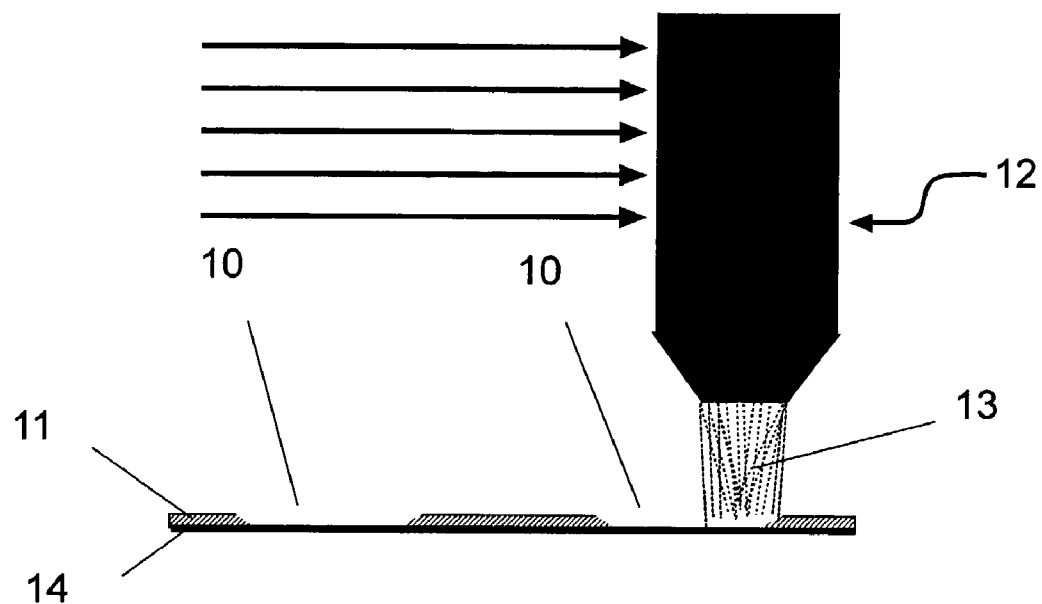
FIG. 1 is a cross-sectional diagram of a laser beam 13 and substrate without conformal mask as it removes dielectric material 11 from a copper 14 surface. The beam is moving at a slow speed resulting in shorter and wider material removal.
Figure 2:
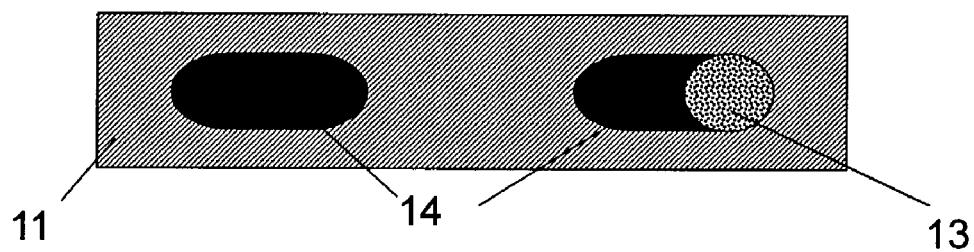
FIG. 2 is a top view of FIG. 1, which shows the laser beam 13 as it is drilling a longer space or oblong opening 14 in the dielectric material 11 exposing the bottom of the copper sheet 14. The beam is moving at the same speed in FIG. 1 and shows its width as it removes dielectric material 11.
Figure 3:
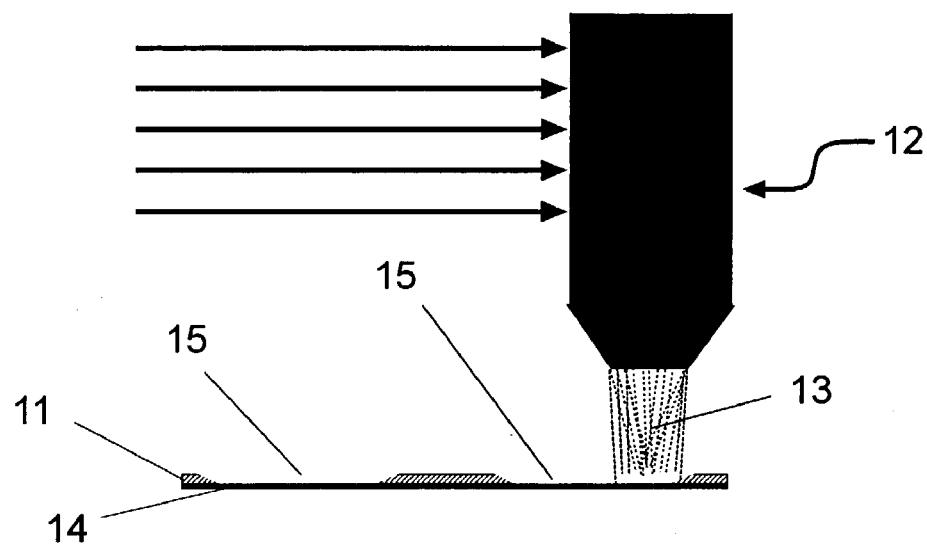
FIG. 3 is a cross-sectional diagram of a laser beam 13 and substrate without conformal mask as it removes dielectric material 11 from a copper 14 surface. The beam is moving at a rate faster than in FIGS. 1 and 2 and displays narrower and longer material removal.
Figure 4:
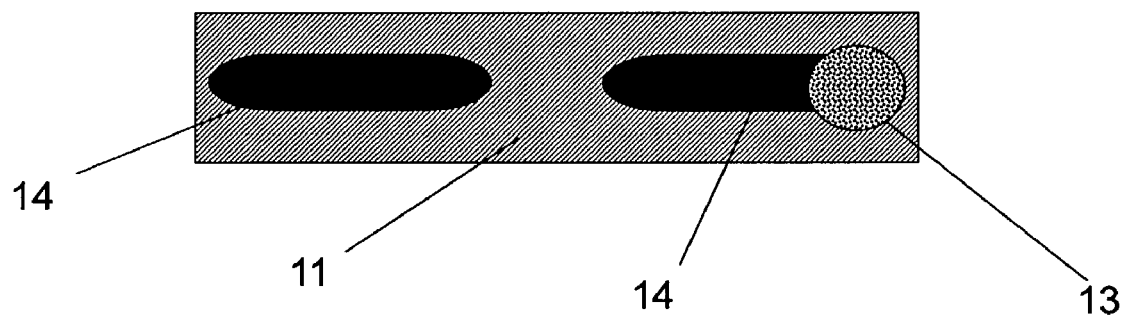
FIG. 4 is a top view of FIG. 3, which shows the laser beam 13 as it removes dielectric material 11 from the copper 14 surface. The beam is moving at the same speed in FIG. 3 and shows its width as it removes dielectric material 11.
Figure 5:
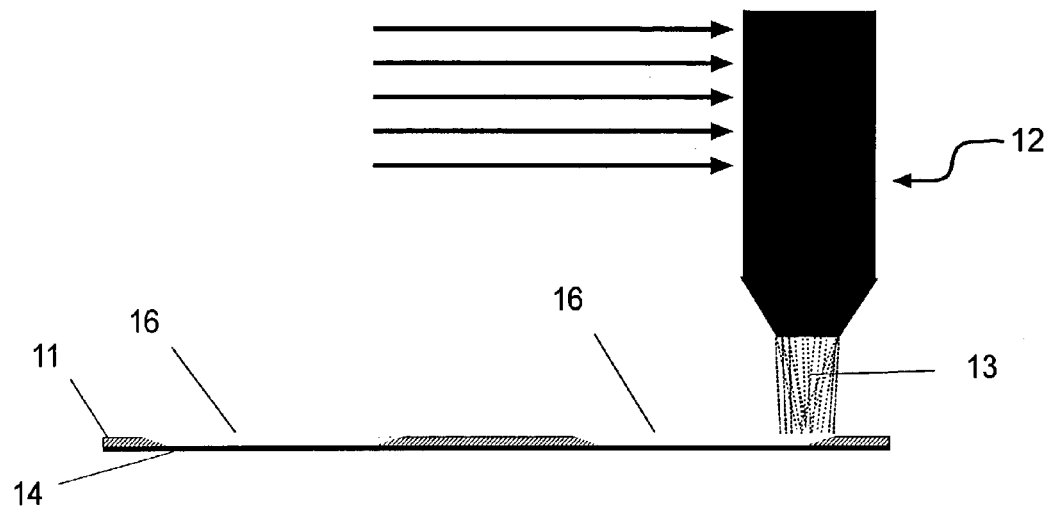
FIG. 5 is a cross-sectional diagram of a laser beam 13 and substrate without conformal mask as it removes dielectric material 11 from a copper 14 surface. The beam is moving at a rate faster than in FIGS. 3 and 4 and displays narrower and longer material removal.
Figure 6:
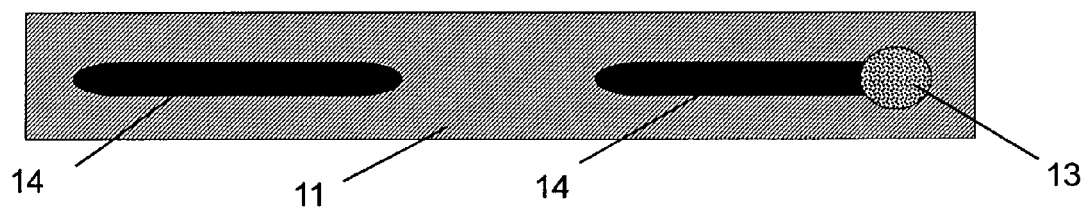
FIG. 6 is a top view of FIG. 5, which shows the laser beam 13 as it removes dielectric material 11 from the copper 14 surface. The beam is moving at the same speed in FIG. 5 and shows its width as it removes dielectric material 11.
Figure 7:
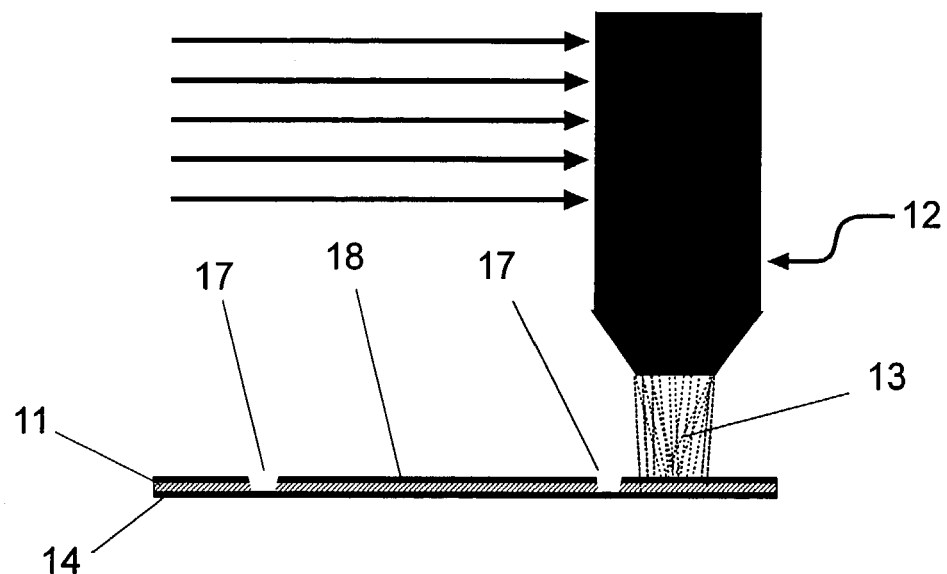
FIG. 7 is a cross-sectional diagram of a laser beam 13 and substrate with a conformal mask as it removes dielectric material 11 from a copper 14 surface. The beam is moving at the same rate as shown in FIGS. 1 and 2. Dielectric material 11 is removed from the opening creating a path 17 to the base.
Figure 8:
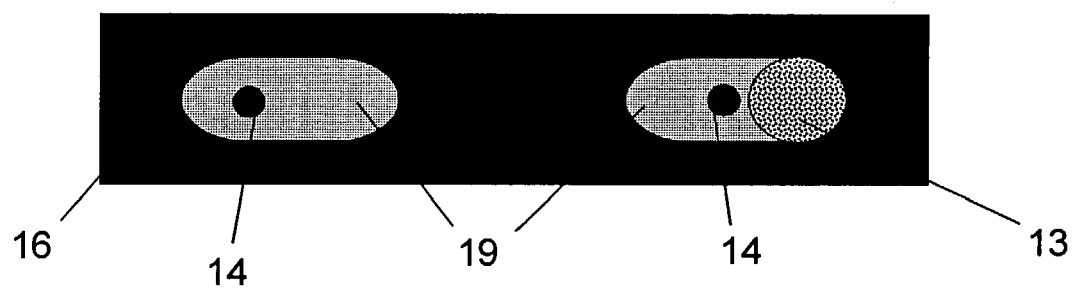
FIG. 8 is a top view of FIG. 7, which shows the laser beam 13 as it removes dielectric material 11 from the copper 14 surface. The beam is moving at the same speed in FIG. 7 and the drawing shows the beam 13 as it is reflected from the surface of the conformal mask 16. The beam that is reflected from the surface 16 is denoted as 19.
Figure 9:
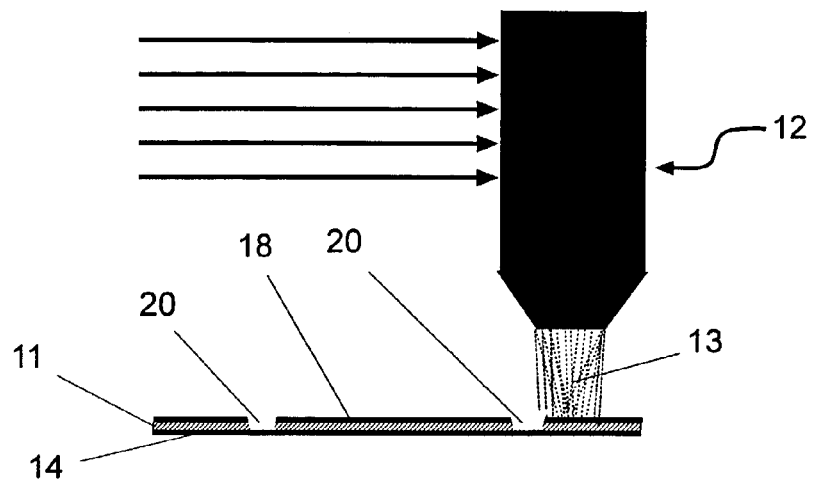
FIG. 9 is a cross-sectional diagram of a laser beam 13 and substrate with a conformal mask 15 as it removes dielectric material 11 from a copper 14 surface. The beam is moving at a faster rate than what is shown in FIGS. 7 and 8. Dielectric material 11 is removed from the opening creating a path 20 to the base.
Figure 10:
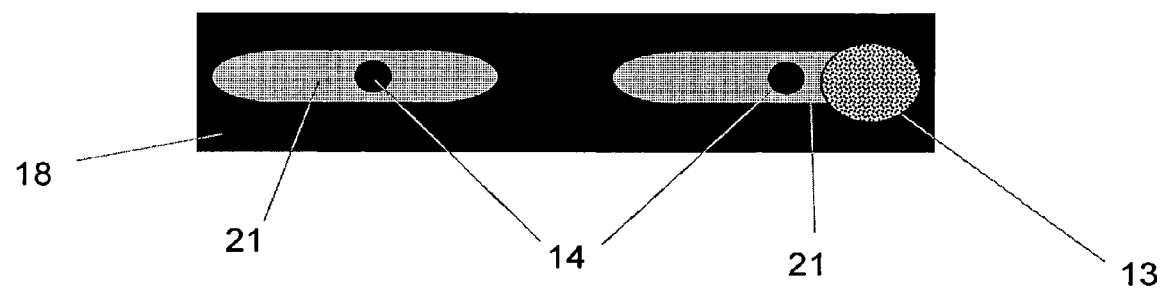
FIG. 10 is a top view of FIG. 7, which shows the laser beam 13 as it removes dielectric material 11 from the copper 14 surface. The beam is moving at the same speed in FIG. 9 and the drawing shows the beam 13 as it is reflected from the surface of the conformal mask 18. The beam that is reflected from the surface 16 is denoted as 21.
Figure 15:
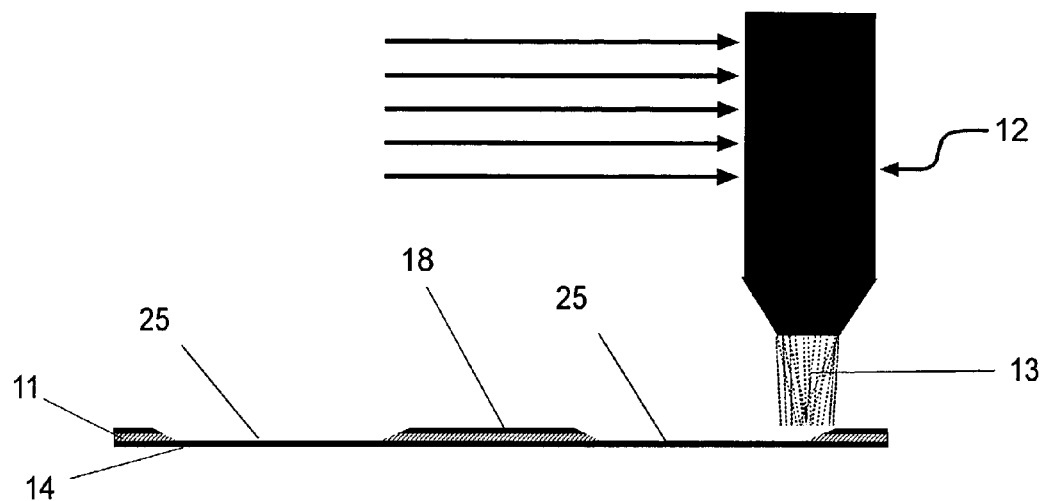
FIG. 15 is a cross-sectional diagram of a laser beam 13 and substrate with a conformal mask 18 as it removes dielectric material 11 from a copper 14 surface. The beam is moving at the same rate as shown in FIGS. 13 and 14. The beam is removing a longer length of material which will result in a slot. Dielectric material 11 is removed from the opening creating a path 25 to the base.
Figure 16:
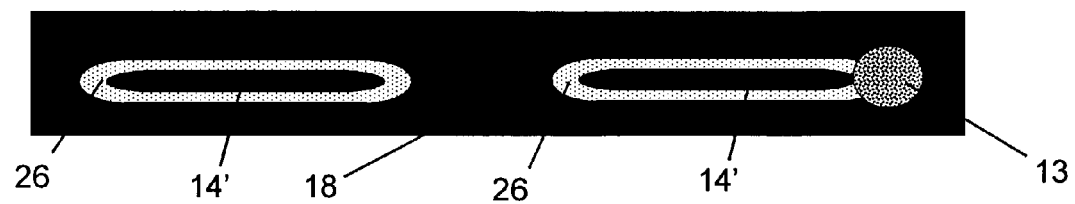
FIG. 16 is a top view of FIG. 15, which shows the laser beam 13 as it removes dielectric material 11 from the copper 14' surface. The beam is moving at the same speed in FIG. 15 and the drawing shows the reflection of the laser beam 26 as it is shown in FIGS. 8, 10 and 12; however it does show the material removed below the opening in the conformal mask 18 as slots 14'.

The size of the beam is controlled by several variables, including the speed of the traveling laser beam. FIGS. 1–6 show three different speeds where the laser beam is set at a constant pulse duration and at the same focus, but the speed of the beam movement is increased by at least 50% in two consecutive stages. The difference in beam speed is manifested in the length and width of the functional beam. This variation can be tested on a material such as resin-coated copper, where the beam is turned on and off for a few simulated trials. In addition, an operating window can be obtained for a given focal length and pulse duration. By changing the speed of the beam delivery, a narrower and longer useful beam can be obtained. Once these set-up tests have been run (as shown in FIGS. 1–6), a relief on one side of a thin core of material can be etched open (called a "window") and the same set-up tests can be run as shown in FIGS. 7–12. These runs yield a clean microvia or slot as shown in FIGS. 15 and 16. The majority of the beam will be reflected from the copper conformal mask 18 as the laser beam 13 is maneuvered over the etched windows. FIG. 8 shows the amount of reflected beam 19 as the beam passes over the windows 17 and removes the dielectric material 11 down to the bounce pad 14. FIGS. 9 through 12 show the results of increasing the speed of the laser beam 13 as it passes over the etched windows 120 and 22 as the extended length of the beam reflections 21 and 23.

Figure 11:
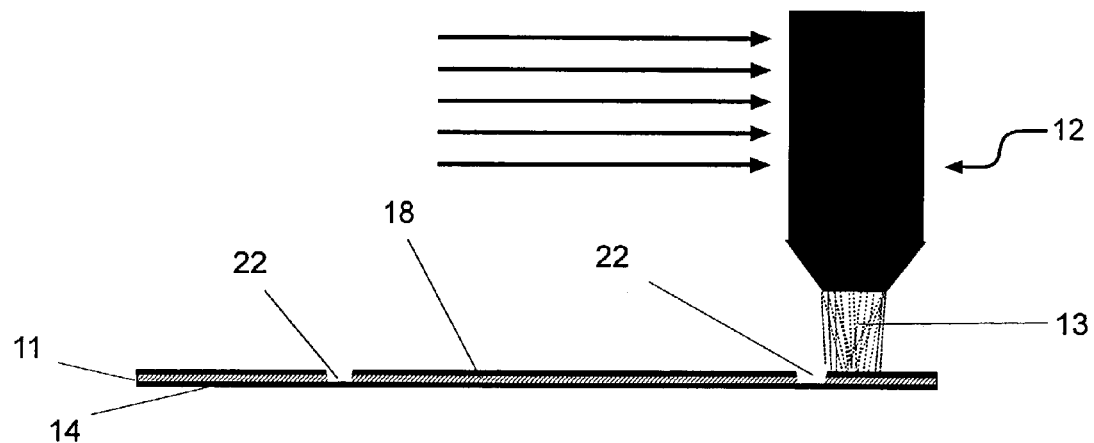
FIG. 11 is a cross-sectional diagram of a laser beam 13 and substrate with a conformal mask as it removes dielectric material 11 from a copper 14 surface. The beam is moving at a faster rate than what is shown in FIGS. 9 and 10. Dielectric material 11 is removed from the opening creating a path 22 to the base.
Figure 12:
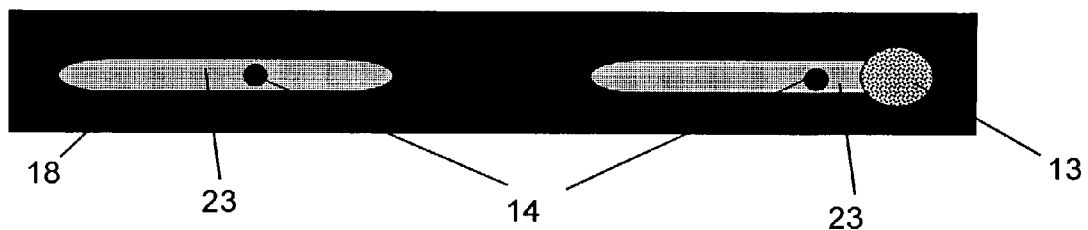
FIG. 12 is a top view of FIG. 11, which shows the laser beam 13 as it removes dielectric material 11 from the copper 14 surface. The beam is moving at the same speed in FIG. 11 and the drawing shows the beam 13 as it is reflected from the surface of the conformal mask 18. The beam that is reflected from the surface 16 is denoted as 23.
Figure 13:
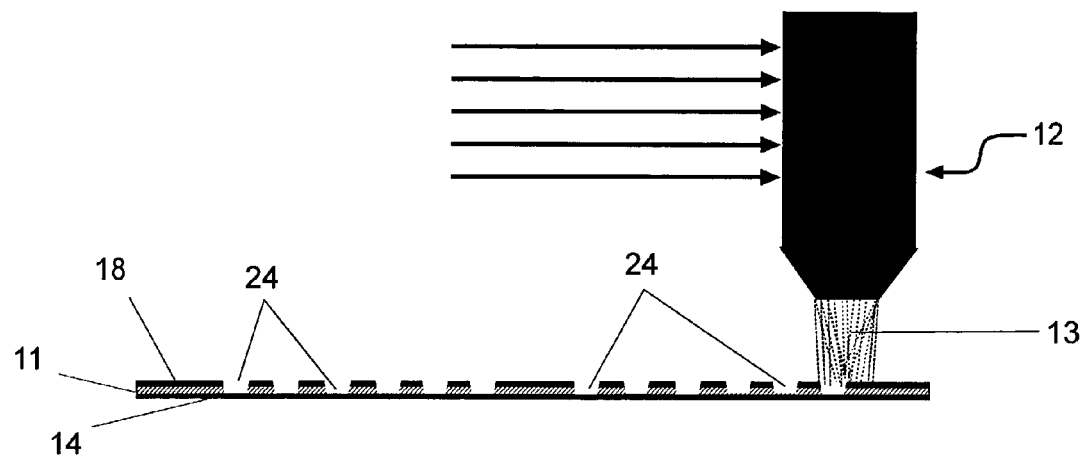
FIG. 13 is a cross-sectional diagram of a laser beam 13 and substrate with a conformal mask as it removes dielectric material 11 from a copper 14 surface. The beam is moving at the same rate as shown in FIGS. 11 and 12. What is shown in this drawing is several opening or vias 10 that are laser drilled with the same pulse. Dielectric material 11 is removed from the opening creating a path 24 to the base.
Figure 14:
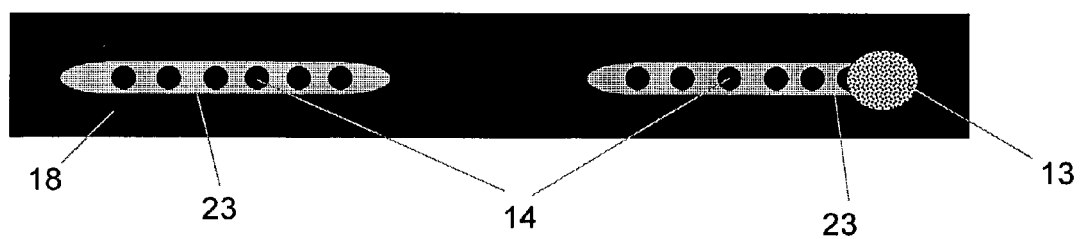
FIG. 14 is a top view of FIG. 13, which shows the laser beam 13 as it removes dielectric material 11 from the copper 14 surface. The beam is moving at the same speed in FIG. 13 and the drawing shows the beam 13 as it is reflected from the surface of the conformal mask 15. This drawing shows several locations where the laser beam has removed dielectric material 11 exposing the buried surface 14. The beam that is reflected from the surface 16 is denoted as 23.
Figure 17:
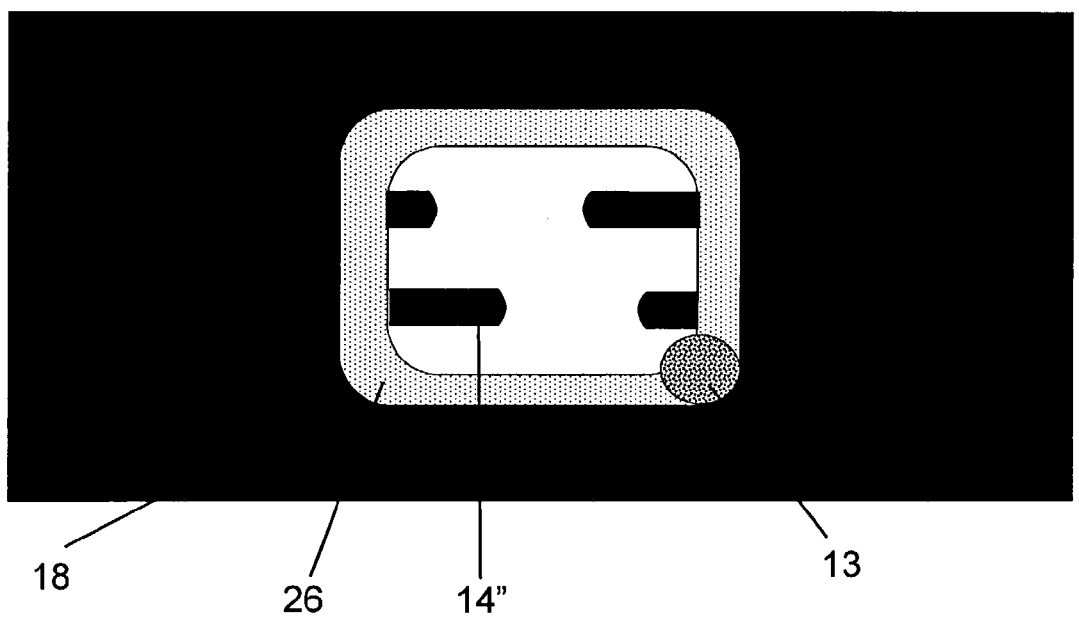
FIG. 17 is a top view of a large area surface of a circuit board, wherein the dielectric material has been removed by laser drilling for attachment of an integrated circuit, also known as chip-in-board.

Using the same conditions as set up in FIGS. 11 and 12, multiple microvias can be produced with the same beam conditions (FIGS. 13–14). Typically, a thin core of circuit board material that has multiple etched windows 24 is used for producing multiple microvias in a single pulse. This result capitalizes on the fact that multiple vias can be laser drilled with a single pulse. Not shown in these drawing are etched windows that enable an interconnect down to a third level, such as those in FIGS. 17–18, where a single pulse is used to remove dielectric material down to the third level 27.

FIGS. 15 and 16 show how a slot 14' can be laser machined as the beam is dragged over an etched window slot 25.

Figure 18:
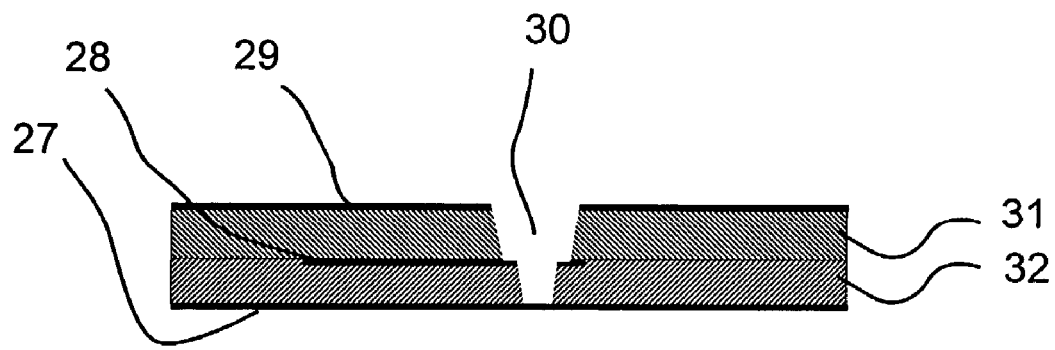
FIG. 18 is a cross-sectional view of a variable depth microvia or micro-slot that has been laser drilled into a three layer circuit board. This will be further processed and become a buried via.
Figure 19:
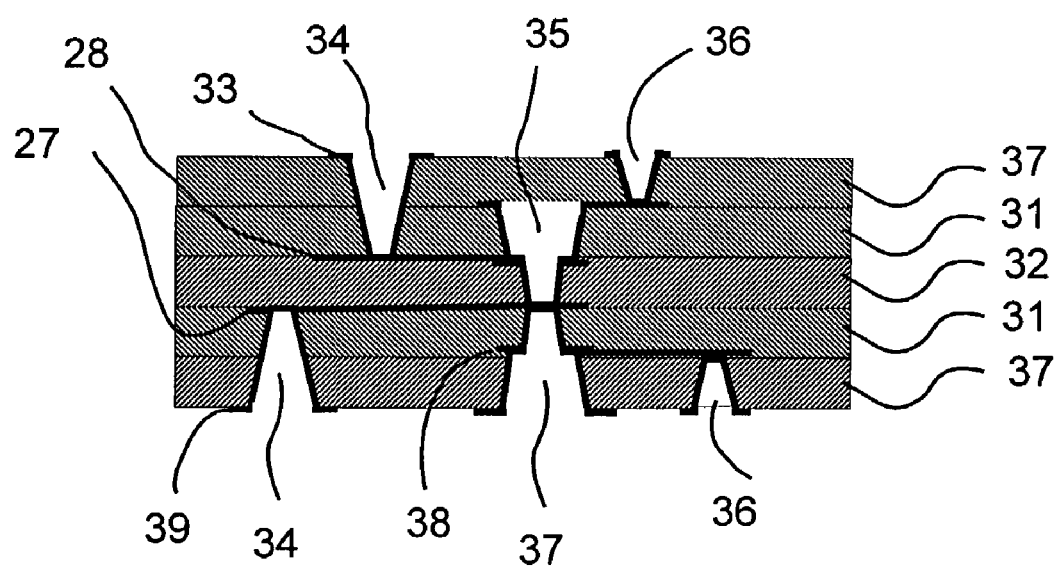
FIG. 19 is a cross-sectional view of a combination of microvias that include single depth 36, two deep 34, variable depth 37, and variable depth buried microvia 35, after plating, final image and etching.

FIG. 18 shows a laser drilled variable depth opening 30 that can be either a slot or circular microvia (from a plan view). This microvia also can be plated, imaged and etched using typical circuit board technologies, then laminated inside a multilayer circuit board to become a "buried microvia". FIG. 19 shows a variety of blind (36, 34 & 37) and buried 35 vias.

Figure 20:
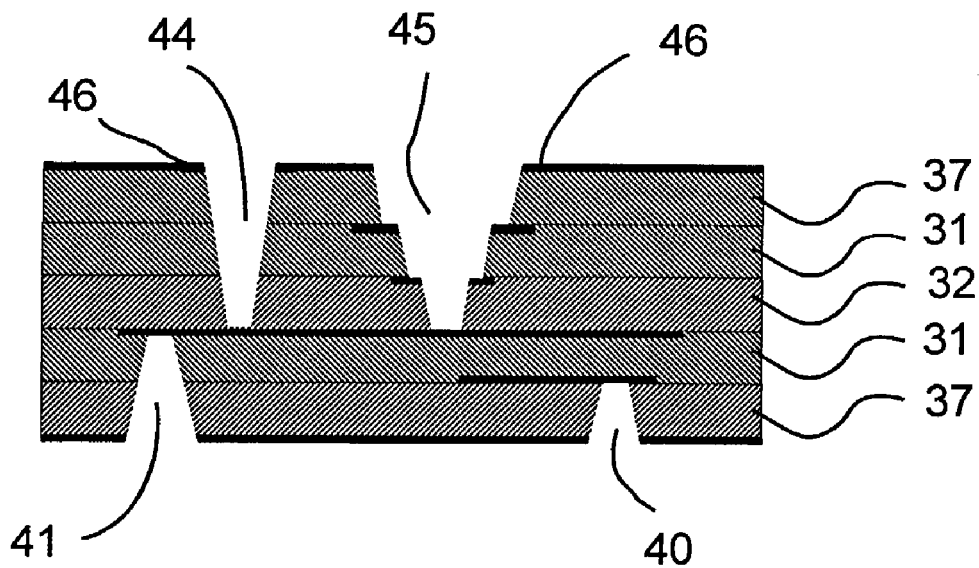
FIG. 20 is a cross-sectional view of blind microvias down to the fourth level 45 and variable depth to levels 2, 3 and 4.
Figure 21:
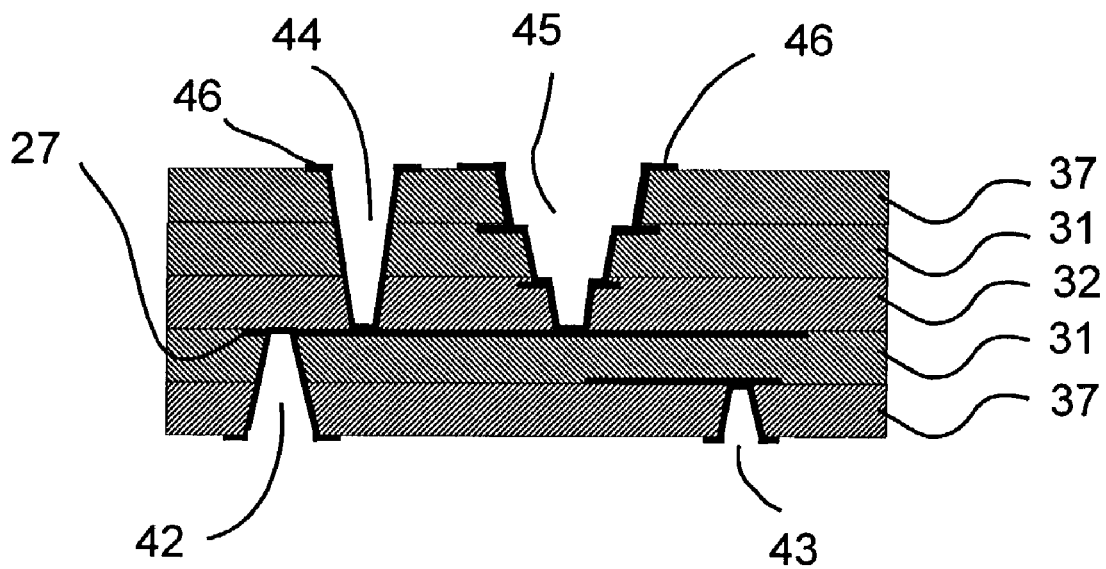
FIG. 21 is a cross-sectional view of FIG. 20 after plating, final image and etching.

FIG. 20 shows a series of blind microvias, interconnecting down to the fourth level 44 and also variable depths 45 to levels two, three and four. FIG. 21 depicts the laser drilled microvias in FIG. 20 after being plated, imaged and etched.

A significant component of the present invention is a laser system (FIG. 22), with articulated arm 48 allowing the laser beam to be located at a constant distance for each position on the panel. In addition, with the use of linear motors 51 and 53, the beam positioning can be moved a high acceleration eliminating distance with each pass across the panel and at speed not available for large sized surface areas such as a circuit board panel.

Figure 24:
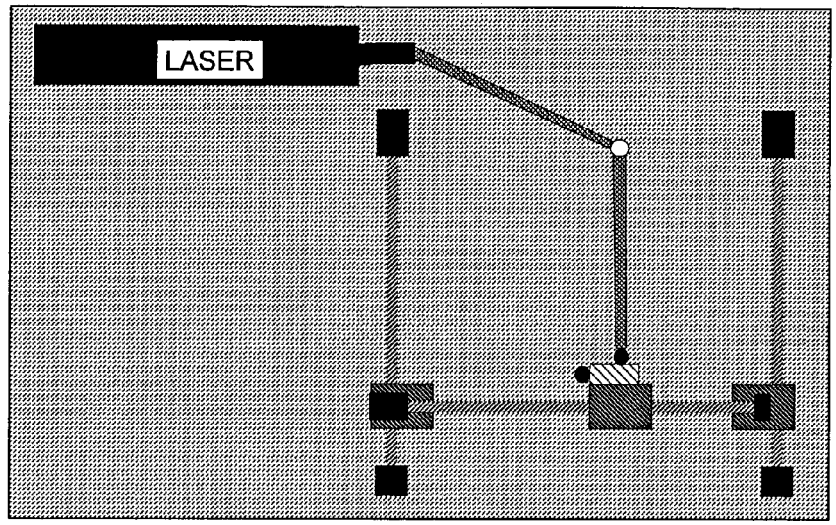
FIG. 24 is a top view of a motion control system for an articulated arm laser beam delivery mounted to a platform.
Figure 25:
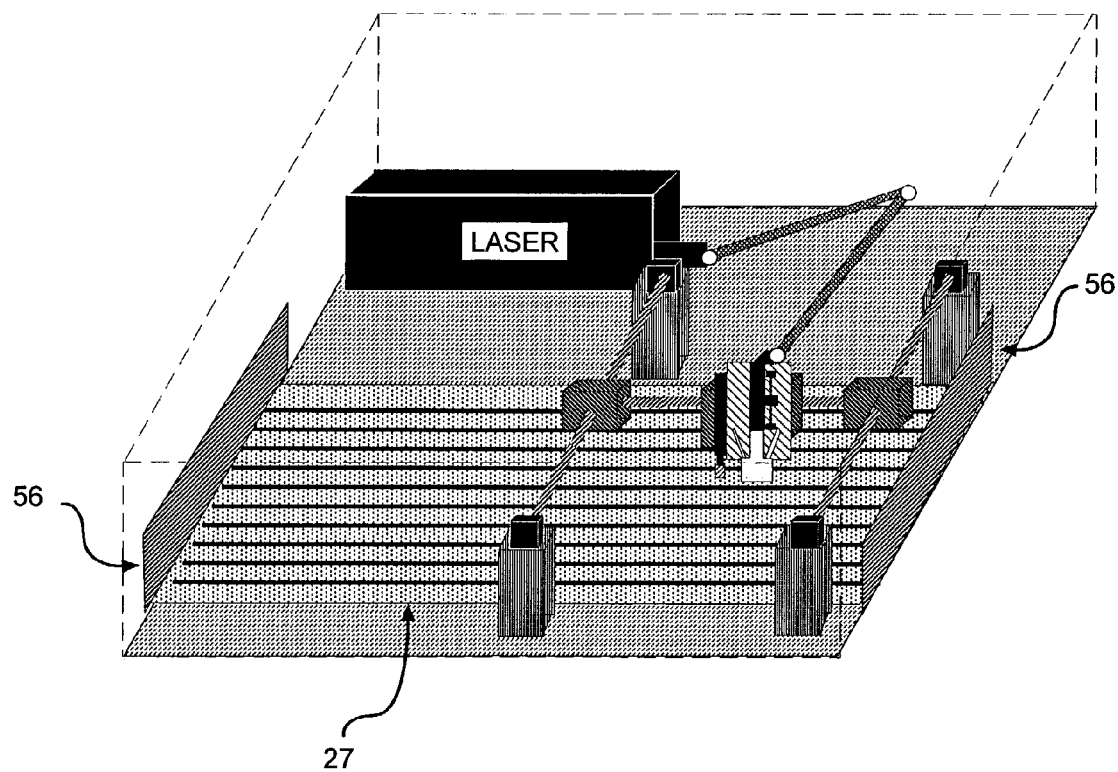
FIG. 25 is a three dimensional view of FIG. 24 with the addition of a conveyor and vacuum hold down 57, entry and exit gates 58 and outlined enclosure.
Figure 26:
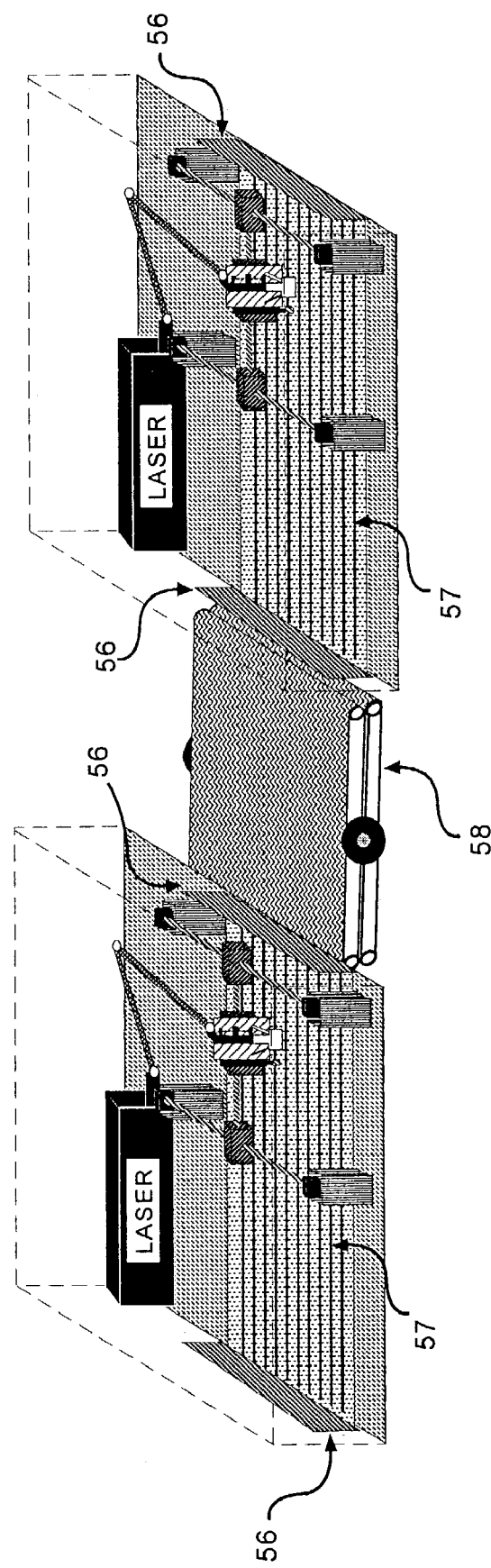
FIG. 26 is a three dimensional view of two laser drilling systems (FIG. 25) aligned with a conveyor 58 in the middle that can flip panel for drilling side two in laser system two.

A novel aspect of this invention is that the conveyorized laser drilling system can be mounted on a platform, as shown in FIG. 24, and "boxed" into a fixture (FIG. 25), where is can then be set up to have a conveyorized vacuum table 57 with doors 56 that open on each side to allow the panels to enter and exit the "boxed" laser drilling module. This arrangement enables the system to drill a panel in one drilling module, as shown in FIG. 26, which panel can then be flipped by a conveyor 58 so that it can enter the second drilling module with the opposite side up (i.e., exposed to the laser).

Figure 27:
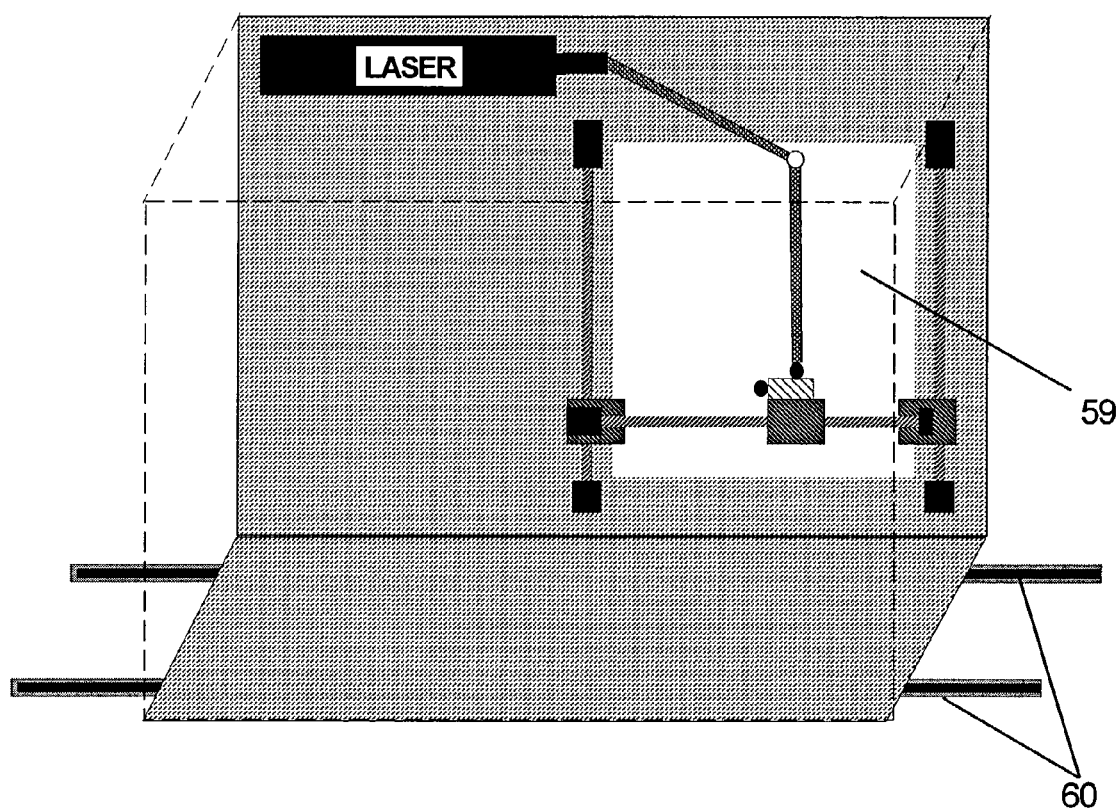
FIG. 27 is a three dimensional drawing with the laser system in FIG. 25 place on its side with a window open to laser drill out the back 59; plus two tracks 60 for moving this system.
Figure 28:
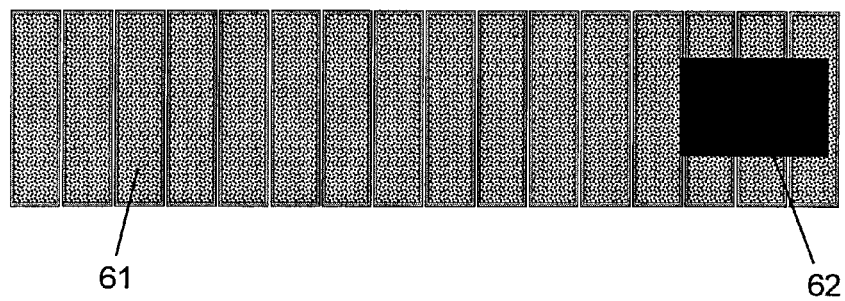
FIG. 28 is frontal views of a series of conveyor pads 61, that are set to hold a panel 62 in place with vacuum and move at a constant speed.
Figure 29:
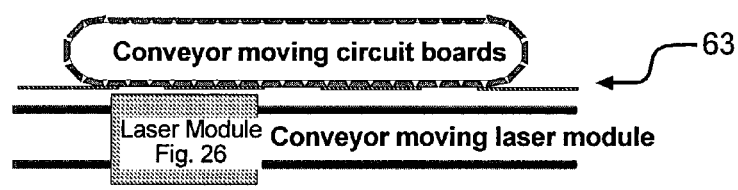
FIG. 29 is a top view of a continuous conveyor in an oval with the laser module from FIG. 23 on a track.
Figure 30:
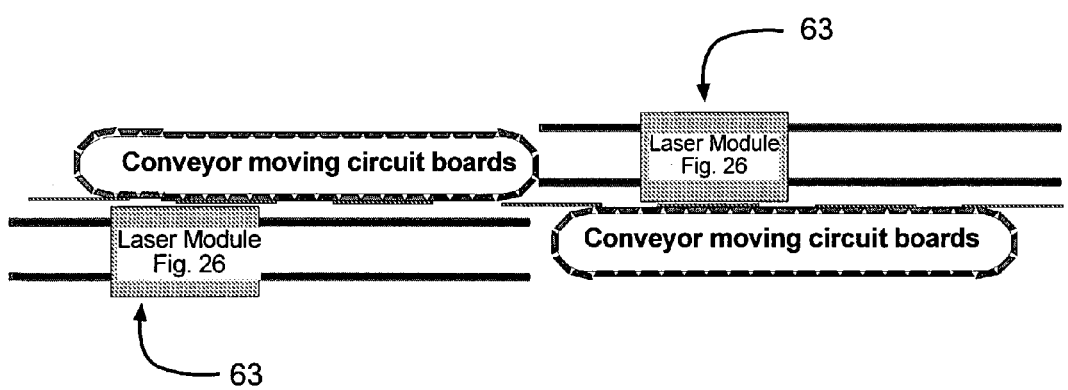
FIG. 30 is the top view of two conveyorized laser systems FIG. 29, transposed to align so that the panels will travel from one system to the other and both sides of the panel are laser drilled.

Another novel employment of this technique, shown in FIG. 27, is to machine an opening 59 that will allow the laser beam to be outputted to one side. The module as shown in FIG. 27 can them be mounted on tracks 60 and moved. A conveyorized vacuum table (FIG. 28) with independent vacuum panels 61 can be mounted in an oblong manner as shown in FIG. 29, with the conveyorized laser on a track. This configuration permits the panels to be moved at an essentially constant velocity. The laser system module also is operative to move at a faster rate, so that it can laser-drill a panel and move back to the front or beginning of the conveyor system to pick up another panel. In addition, two systems can be placed in a mirror-image to each other (i.e., an opposing end-to-end arrangement as shown in FIG. 30), so that panels can be laser-drilled on one side, transported to the second module and laser-drilled on the other side.

Figure 31A:
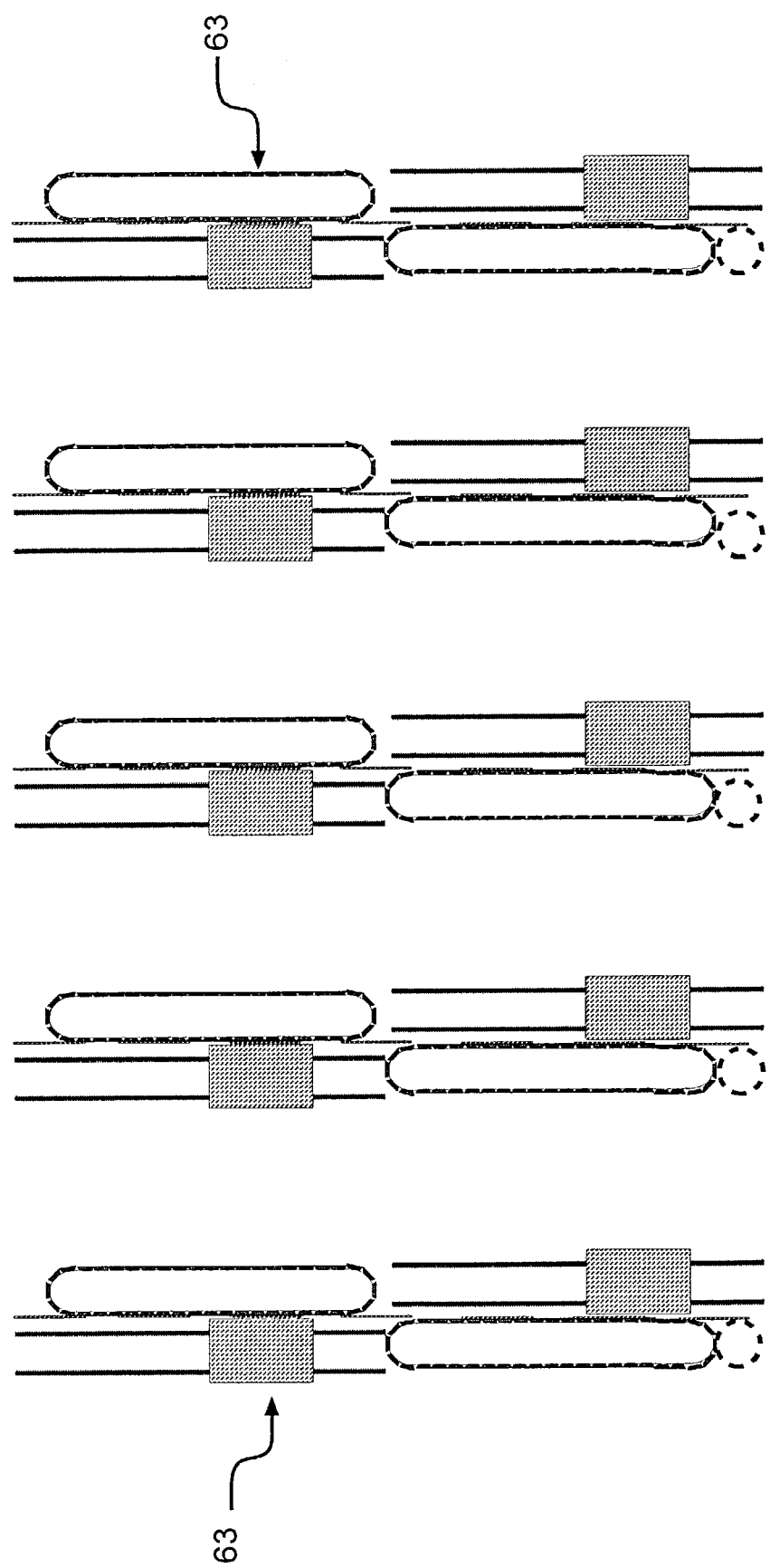
FIGS. 31A and 31B show a top view of a series of conveyorized laser systems (5 sets), as shown in FIG. 30, that culminate to a central point and then the panels will travel through a final laser system.
Figure 31B:
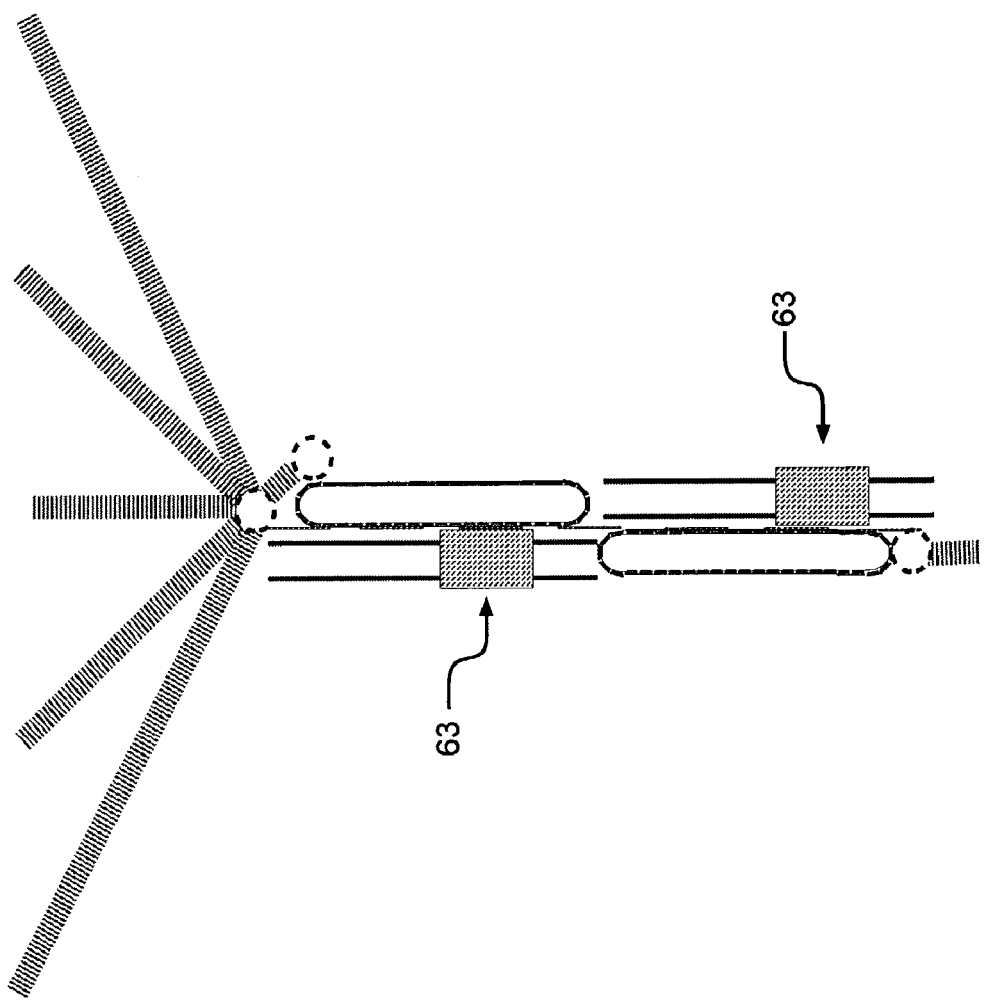

FIG. 31 shows how a complete production system could be arranged for laser drilling the copper surface instead of chemically etching the windows. The laser for this arrangement is preferably a UV laser system, and other system changes also may be considered.

Figure 32:
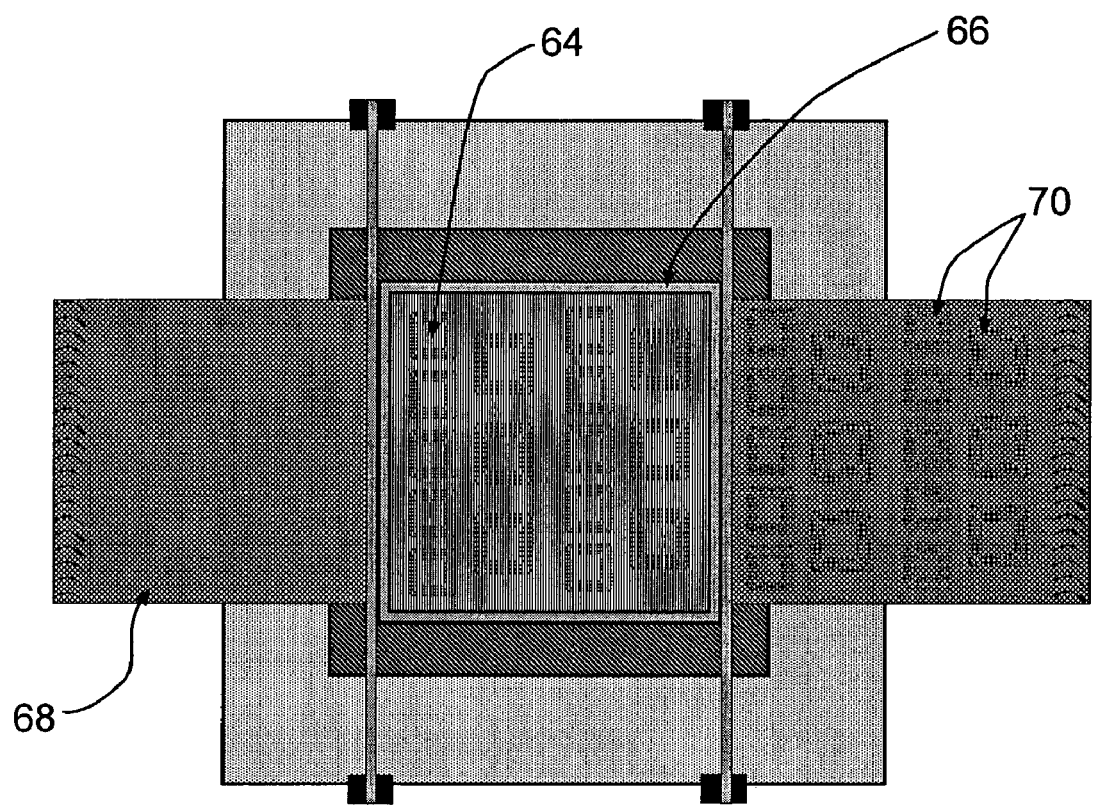
FIG. 32 is a plan view of a reel-to-reel table used in a laser drilling system according to the invention for drilling vias in a continuous roll of material.

FIG. 32 shows a top view of a stainless steel mask 64 mounted in a frame 66, which may be automatically raised and lowered over a dielectric material 68 that is set up in a traditional reel-to-reel handling device which is typically used in the manufacture of raw dielectric material at a circuit board lamination factory. The reel-to-reel method rapidly moves and indexes the dielectric material 68 under the mask 64 for laser drilling. The laser drilled image 70 in the dielectric material 68 is shown as the image near the top of FIG. 32, which is the same as shown in the mask 64 in the center of FIG. 32. The mask image is cut into the stainless steel by chemical etching or laser drilling typically with a UV laser system that is commonly found in the industry where solder paste masks are manufactured.

Figure 33A:
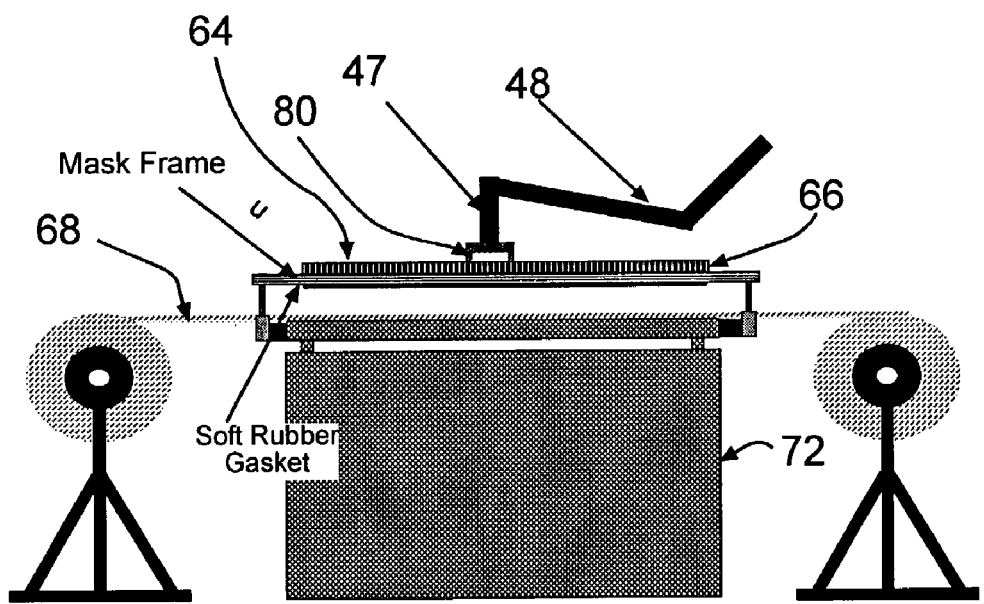
FIG. 33A is an elevation view of the laser drilling system and table of FIG. 32 showing the slotted mask lifted off of the material for indexing the material to next drilling position.
Figure 33B:
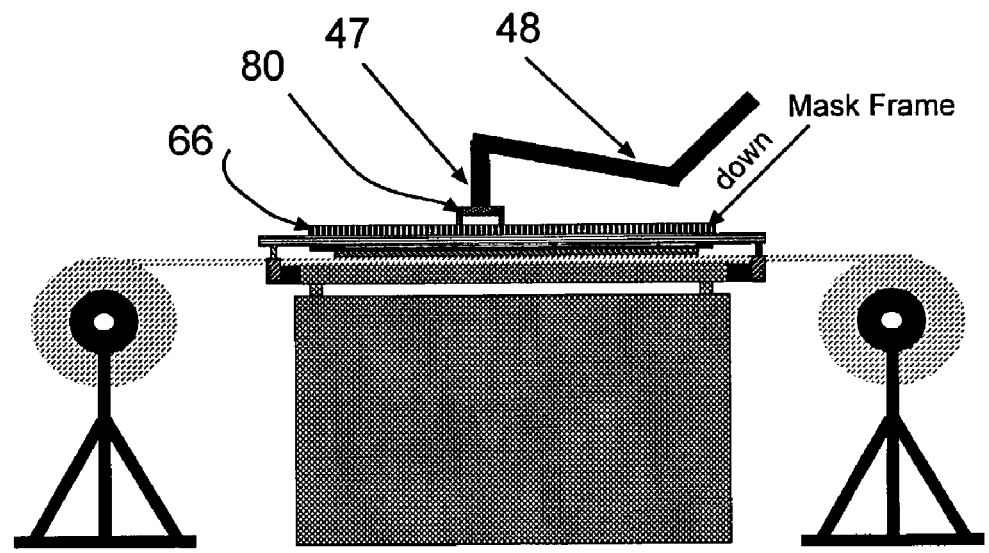
FIG. 33B is an elevation view of the laser drilling system and table of FIG. 32 showing the first roll feeding material to the laser and the second roll collecting the drilled material with the slotted mask pressed down onto the material for drilling.
Figure 35A:
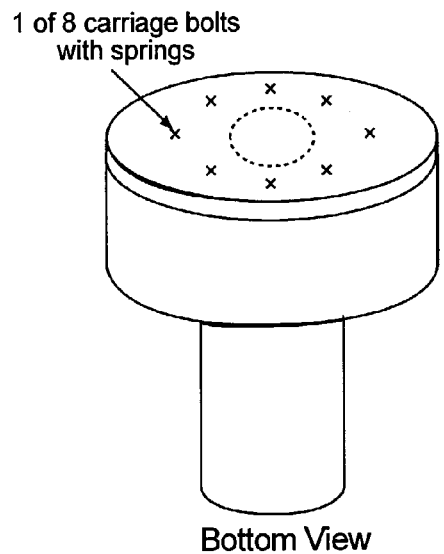
FIG. 35A is a perspective view of the bottom of the laser head and FIG. 35B is a cross-sectional view thereof.
Figure 35B:
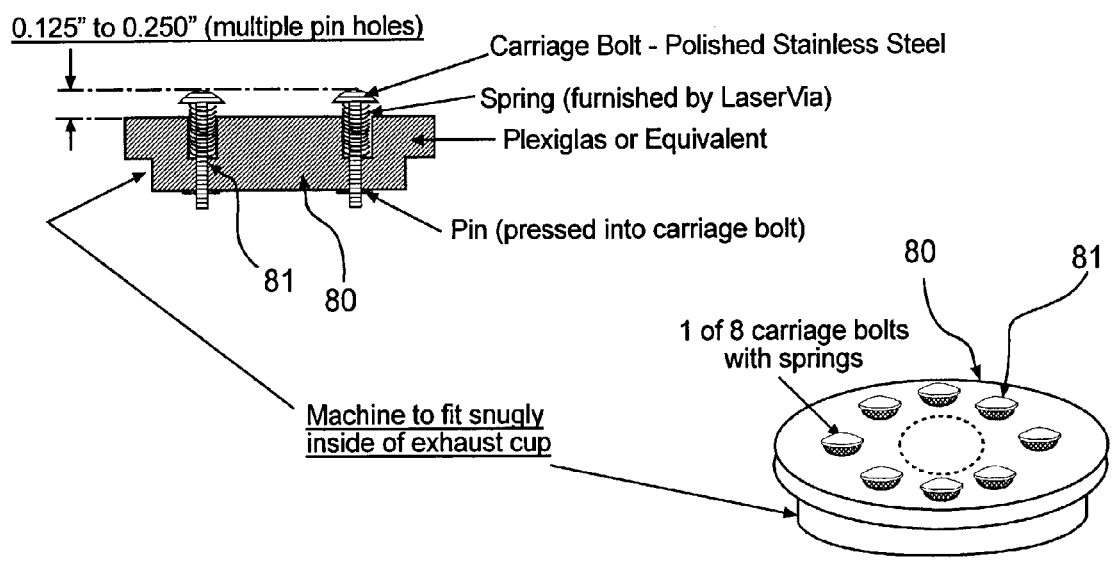

The material 68 is indexed under the frame 66 with the frame elevated as shown in FIG. 33A. The stainless mask 64 is then lowered onto the laser table 72 as shown in FIG. 33B, over a reflective metal material such as copper, stainless steel or other shiny metal surface to act as a bounce pad for the laser beam as the articulated arm 48 and beam delivery 47 move a beam head 80 to pass the laser beam over the mask in constant motion for true laser drilling on the fly, enhancing one of the key novel aspects of this invention. The articulated arm 48 and beam delivery 47 are configured (e.g. weighted when oriented downward) to apply a normal force of the beam head 80 against the mask 64 sufficient to retain the mask in intimate contact with the material 68 and avoid lifting of the mask by an impinging air stream during drilling. The beam head 80, shown in further detail FIGS. 35A and 35B, is arranged with a low friction contact surface to interface with the mask 64 in a way to avoid lateral shifting of the mask during drilling. This low friction contact surface can be provided by the rounded, polished stainless steel heads of carriage bolts 81 or by ball bearings or high molecular weight plastic bearings.

The laser drilling system shown in FIG. 32 is operable by in-feeding a continuous layer of dielectric polymeric material to a drilling table, indexing the material into position for drilling. The drilling table clamps a mask with circular or non-circular slots to the material. Then drilling is achieved by passing a laser across the mask. The material is then released and the material is indexing to a next drilling position. The foregoing steps are repeated.

Figure 34:
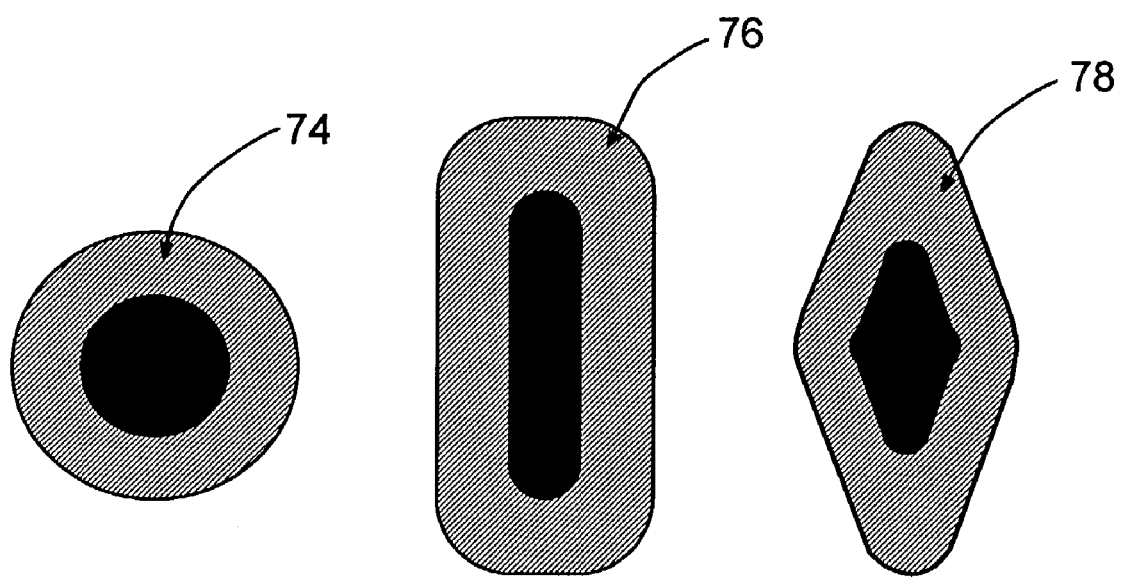
FIG. 34 is a top view of FIG. 15 showing three different possible shapes of vias laser drilled into dielectric material.

The unique ability to make slots, single or double depths, with single laser pulses using the conformal mask has been described in FIGS. 15 and 16. Similar images can also be produced using the stainless steel mask shown in FIG. 32. FIG. 34 shows various examples of possible shapes of blind microvias that can be drilled according to the invention.

FIG. 34 shows round 74, slotted 76 and rounded diamond-like 78 blind microvias. However, other shapes are possible such as elliptically shaped blind microvias.

The demand for laser-drilled microvias has grown substantially over the past few years and shows no sign of diminishing. The most interesting predicament in the growth of microvias on a panel (including both blind and buried vias currently being created with the use of lasers) is the rampant increase in blind vias on a panel in comparison to the number of panels with microvias. While both are in a strong growth pattern, it is the number of microvias on a panel that is most significant. Considering an approximate panel size of 450 mm by 610 mm (18 inches by 24 inches, which is most commonly used in production), the high-end demand for laser-drilled microvias has grown to nearly 250,000 microvias per panel. Since there is a huge diversity in output from various laser systems, it is clear that there is a need for a true production method to bring the output for a panel into the 3- to 5-minute range in order to stay in line with the other processes. The following Table 1 shows the output in minutes for several categories of panels with microvia counts starting at 10,000 per panel and rising to 250,000 per panel at average laser drilling rates of from 5 microvias per second up to 1,000 microvias per second. Most suppliers of laser drilling systems do not provide an average output rate since it is dependent on a number of factors, including the layout and density of the microvias on a panel. It is typically the top-end theoretical output that is given for the systems. The projected output in vias per second for the laser drilling system described in this disclosure is expected to exceed 2,000 per second.

TABLE 1

TIME IN MINUTES TO LASER DRILL A PANEL

| Ave. Vias per Second | Vias per Panel | | | | |
|---|---|---|---|---|---|
| | 10,000 | 25,000 | 50,000 | 100,000 | 250,000 |
| 5 | 33.3 | 83.3 | 166.7 | 333.3 | 833.3 |
| 15 | 11.1 | 27.8 | 55.6 | 111.1 | 277.8 |
| 25 | 6.7 | 16.7 | 33.3 | 66.7 | 166.7 |
| 50 | 3.3 | 8.3 | 16.7 | 33.3 | 83.3 |
| 100 | 1.7 | 4.2 | 8.3 | 16.7 | 41.7 |
| 500 | 0.3 | 0.8 | 1.7 | 3.3 | 8.3 |
| 1,000 | 0.2 | 0.4 | 0.8 | 1.7 | 4.2 |

Having described and illustrated the principles of the invention in a preferred embodiment thereof, it should be apparent that the invention can be modified in arrangement and detail without departing from such principles.

What is claimed is:

1. A laser drilling system for drilling blind vias in printed circuit board panels, multichip modules and chipscale packages with top and bottom surfaces and include multiple dielectric polymer and metal layers, the system comprising:
   a first laser module comprising:
   a laser with the capability to form at least one via per pulse through one or more polymer layers wherein the vias are circular or non-circular in shape,
   an articulated arm adapted to move at a speed of about 200 inches per second and at an acceleration of about 5 g's or more, and
   a beam delivery unit attached to the articulated arm wherein
   the beam of the laser travels inside the articulated arm to the beam delivery unit, and
   beam delivery unit focuses the laser beam for use in drilling the top surface;
   a conveyor adapted to move panels at a constant speed with the first laser module positioned to move on a separate track from the conveyor and operable to move at a faster rate than the conveyor to drill the top surface.

2. A laser drilling system of claim 1 further comprising a second laser module positioned to move on another separate track from the conveyor and operable to move at a faster rate than the conveyor so as to drill the bottom surface.

3. A laser drilling system of claim 1 wherein the laser comprises an RF excited CO2 laser having an output of at least 240 watts and operative to pulse approximately 5,000 times per second.

4. The laser drilling system of claim 1 wherein the laser is configured so that a single pulse of the laser drills vias into circuit board or other similar material wherein the vias extend down through either a single conductive layer or multiple conductive layers.

5. A laser drilling system for drilling blind vias in printed circuit board panels, multichip modules and chipscale packages with top and bottom surfaces which include multiple dielectric polymer and metal layers, the system comprising:
   a first laser module comprising:
   a laser with the capability to form at least one via per pulse through one or more polymer layers wherein the vias are circular or non-circular in shape,
   an articulated arm adapted to move at a speed of about 200 inches per second and at an acceleration of about 5 g's or more, and
   a beam delivery unit attached to the articulated arm wherein,
   the beam of the laser travels inside the articulated arm to the beam delivery unit, and
   the beam delivery unit focuses the laser beam for use in drilling the top surface;
   a conveyor adapted to move panels wherein,
   the conveyor moves to deliver the panel to the first laser module, the conveyor stops moving so the first laser module can drill vias in the top surface of the panel, and
   the conveyor moves again to deposit the drilled panel and deliver a new panel.

6. The laser drilling system of claim 5 further comprising:
   means for flipping the drilled panel after the first laser module drills the top surface of the panel;
   a second laser module for drilling the bottom surface of the panel;

a conveyor adapted to move panels wherein,
the conveyor moves to deliver the flipped panel to the second laser module,
the conveyor stops moving so the second laser module can drill vias in the bottom surface of the panel, and
the conveyor moves again to deposit the drilled panel and deliver a new flipped panel.

7. A laser drilling system of claim 5 wherein the laser comprises an RF excited CO2 laser having an output of at least 240 watts and operative to pulse approximately 5,000 times per second.

8. The laser drilling system of claim 5 wherein the laser is configured so that a single pulse of the laser drills vias into circuit board or other similar material wherein the vias extend down through either a single conductive layer or multiple conductive layers.

* * * * *